United States Patent
DeFeo

(10) Patent No.: US 6,605,544 B2
(45) Date of Patent: Aug. 12, 2003

(54) BONDED SAPPHIRE POLYGON SHIELD

(75) Inventor: Anthony DeFeo, Nashua, NH (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 0 days.

(21) Appl. No.: 10/007,605

(22) Filed: Nov. 7, 2001

(65) Prior Publication Data

US 2003/0085120 A1 May 8, 2003

(51) Int. Cl.[7] ......................... H01L 21/00; C30B 29/00; C23C 14/34
(52) U.S. Cl. ............. 438/716; 204/298.01; 204/298.11; 118/504; 438/800
(58) Field of Search ........................... 117/1; 118/504, 118/505; 156/345.1, 345.3; 204/298.01, 298.11, 298.31, 298.36; 438/800, 795, 798, 710, 707, 716

(56) References Cited

U.S. PATENT DOCUMENTS 5,201,977 A * 4/1993 Aoshima .................... 156/153
6,012,303 A * 1/2000 Axelson et al. ............ 65/36

* cited by examiner

Primary Examiner—Evan Pert
(74) Attorney, Agent, or Firm—McCormick, Paulding & Huber LLP

(57) ABSTRACT

A shield for protecting silicon wafers. The shield includes a plurality of single crystal shielding members having a lattice unit cell repeated substantially throughout. The unit cell has a periodic arrangement of atoms defining a set of lattice planes. The shielding members each include a pair of first interface surfaces having an orientation substantially aligned along one of the set of lattice planes. The shield also includes a plurality of single crystal structural members each having substantially the same lattice unit cell as that of the shielding members repeated substantially throughout. The structural members each include a pair of second interface surfaces having an orientation substantially aligned along the same one of the set of lattice planes. The plurality of shielding members and structural members are alternately bonded together at their respective first and second interface surfaces to define an enclosed area sized to receive the silicon wafers therein.

24 Claims, 5 Drawing Sheets

BONDED SAPPHIRE POLYGON SHIELD

CROSS-REFERENCE TO RELATED APPLICATIONS

The present application is related to co-pending application Ser. No. 10/007,606 entitled, "Method for Producing a Polygonal Sapphire Structure", to Ardini et al. (Attorney Docket No. 6096-04) filed concurrently herewith and incorporated herein by reference.

FIELD OF THE INVENTION

The present invention relates to semiconductor manufacturing. More specifically, the present invention relates to bonded sapphire polygonal shields for providing contamination control during silicon wafer processing.

BACKGROUND OF THE INVENTION

It is critical that the fabrication of semiconductor devices, such as Very Large Scale Integrated (VLSI) and Ultra Large Scale Integrated (ULSI) circuits, takes place on silicon substrates having very high crystalline perfection or purity. Very high crystalline perfection requires that the silicon substrate possess a minimum of impurities and structural defects throughout its single crystal silicon lattice.

Generally during semiconductor manufacturing, raw material, e.g., quartzite, is refined into electronic grade polysilicon (EGS) and melted. A silicon seed crystal is than used to grow a single crystal silicon ingot from the molten EGS. The ingot is then precisely sliced and polished into silicon wafers. The silicon wafers provide the substrates upon which VLSI and ULSI circuits are ultimately built through a complex sequence of wafer fabrication processes.

However, many of these fabrication processes take place in process chambers under extreme conditions, such as those found in high-temperature, high-pressure or harsh chemical environments. Problematically, these extreme conditions can erode the chamber walls, causing severe contamination problems. Examples of such processes and their associated contamination problems include the following:

During Physical Vapor Deposition (PVD), plasma is used to sputter a target material onto a wafer. However, the process chamber (typically aluminum) may be sputtered off and contribute to the contamination of the wafer being processed.

Etching processes utilize various chemistries to etch features into the wafer. These chemistries often break down materials present in the process chamber which can potentially contaminate the wafer being etched.

During Ion Implantation processes stray ions may react with surrounding chamber walls causing unwanted reactions which can further contaminate a wafer.

Prior art structures for addressing the problems of contamination control include coated chamber walls or chamber walls constructed out of materials which match the wafer materials being processed, e.g. silicon. However, these structures do not eliminate the contamination process, but rather provide a sympathetic contaminant that can be tolerated by the wafers being processed. Additionally, the construction of these specialized chambers is excessively expensive. Moreover, their use is limited to processing only those wafers having material compatible with the chamber walls.

Additionally, prior art structures or shields designed to protect the silicon wafers from contamination must also be able to withstand high temperature processing of the wafers without damage. However, if a shield were to be constructed with materials having different coefficients of expansion, the shields may crack or shatter. Even structures composed entirely of a single crystal material will encounter problems with different coefficients of expansion along the different lattice planes of the crystal.

Based on the foregoing, it is the general object of the present invention to provide a structure that overcomes the problems and drawbacks associated with prior art contamination control structures.

SUMMARY OF THE INVENTION

The present invention offers advantages and alternatives over the prior art by providing in a first aspect a shield for protecting silicon wafers. The shield includes a plurality of single crystal shielding members having a lattice unit cell repeated substantially throughout. The unit cell has a periodic arrangement of atoms defining a set of lattice planes. The shielding members each include a pair of first interface surfaces having an orientation substantially aligned along one of the set of lattice planes. The shield also includes a plurality of single crystal structural members each having substantially the same lattice unit cell as that of the shielding members repeated substantially throughout. The structural members each include a pair of second interface surfaces having an orientation substantially aligned along the same one of the set of lattice planes. The plurality of shielding members and structural members are alternately bonded together at their respective first and second interface surfaces to define an enclosed area sized to receive the silicon wafers therein.

In an alternative embodiment of the invention, the orientations of the lattice planes of the shield are defined by a set of miller indices. The first and second interface surfaces have orientations substantially defined by an identical one of the set of miller indices.

In another embodiment of the invention, the shielding members are composed of sapphire plates. Additionally the structural members are composed of sapphire bars and/or sapphire rods.

In another embodiment of the invention, the shielding members and structural members are bonded together with a eutectic bonding material. The eutectic bonding material may also include a yttrium-containing compound.

DETAILED DESCRIPTION OF THE PREFERRED EMBODIMENTS

Figure 1:
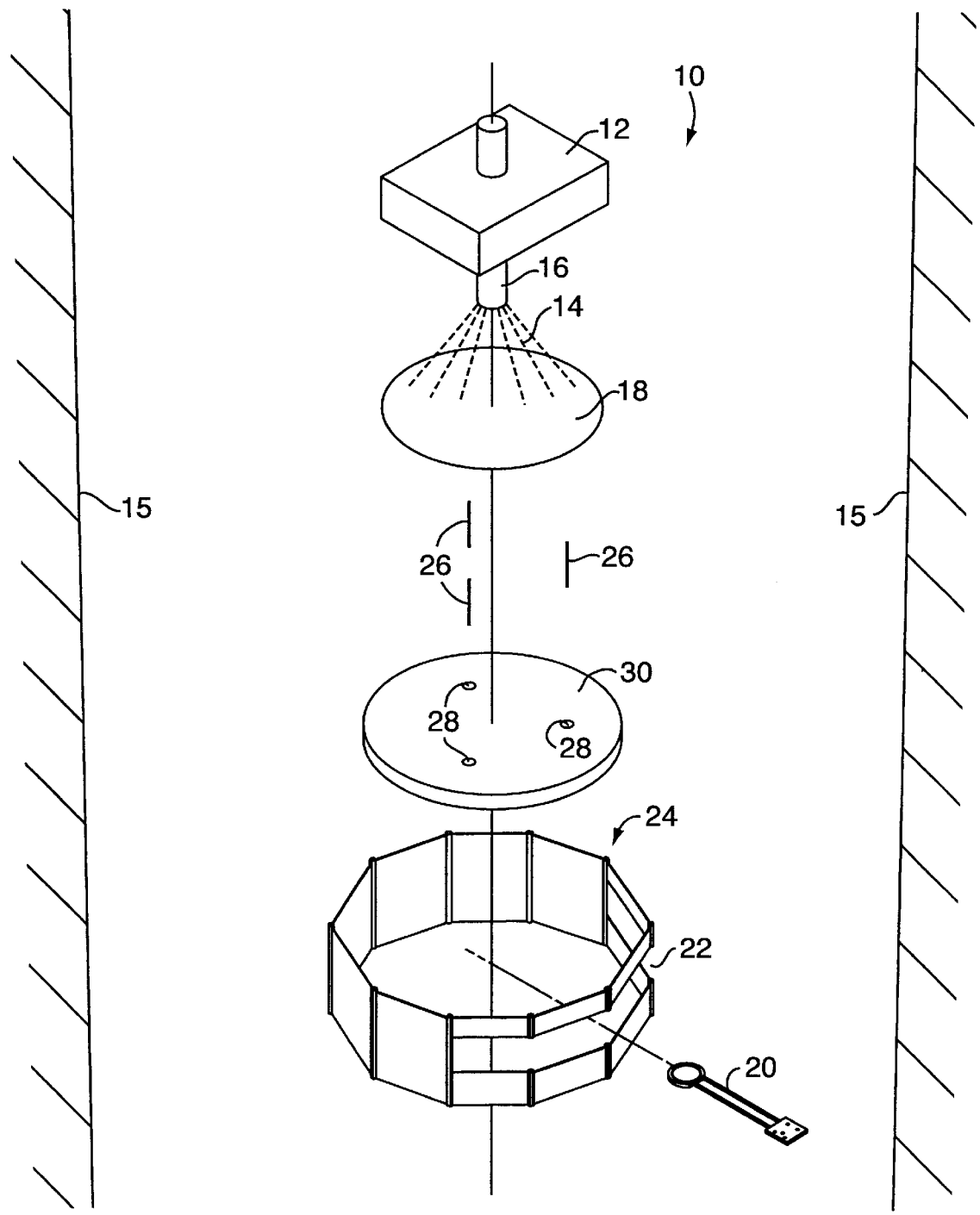
FIG. 1 is an exploded view of a plasma etching process in accordance with the present invention.
Figure 2:
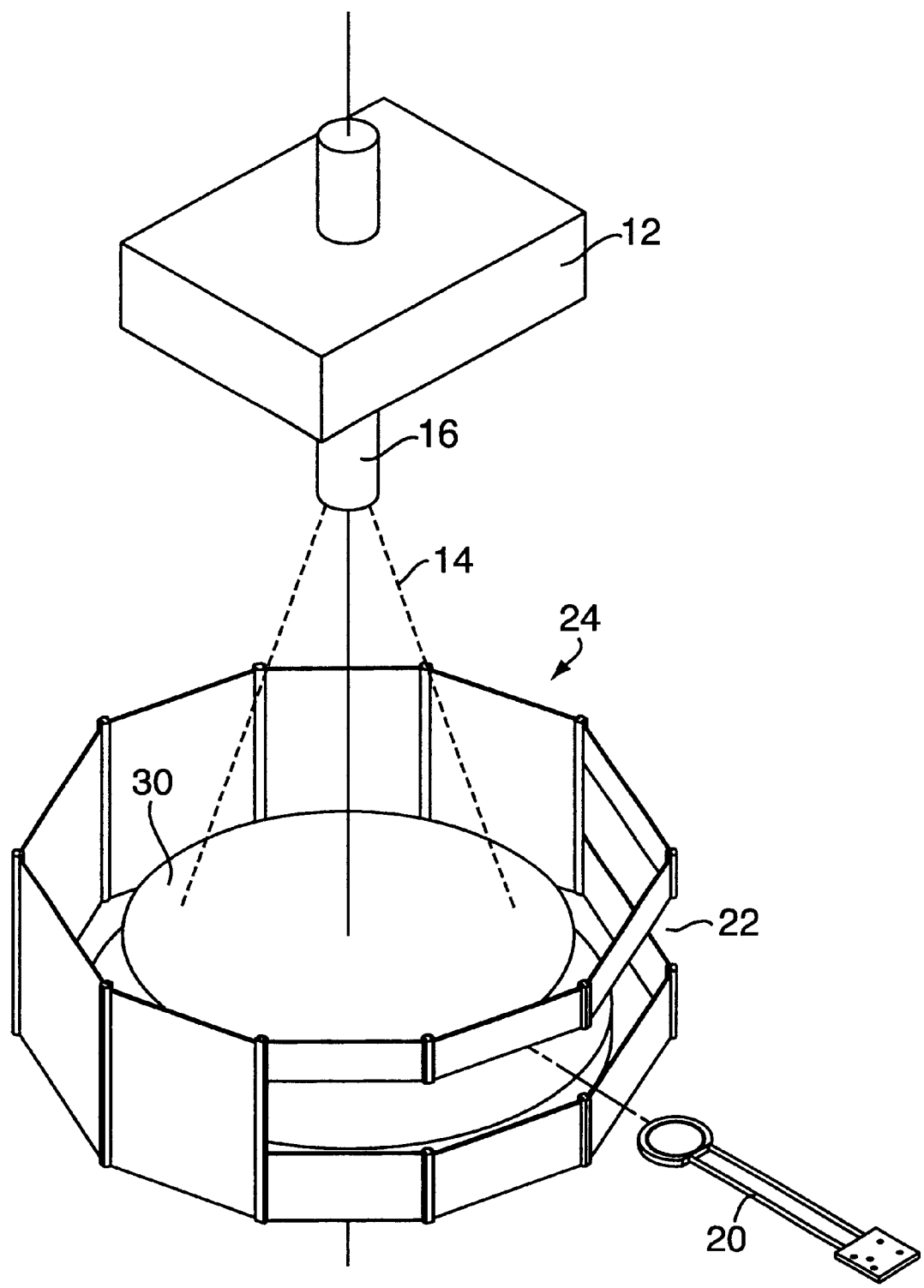
FIG. 2 is a perspective view of the plasma etching process of FIG. 1.

Referring to FIGS. 1 and 2, an exemplary embodiment of a plasma etching process, e.g., photoresist dry etching, in accordance with the present invention is shown generally at 10. A plasma is defined to be a partially ionized gas composed of ions, electrons, and a variety of neutral species. Plasmas including fluorine-containing gases are extensively used for etching Si, $SiO_2$, $Si_3N_4$ and other materials used in ULSI fabrication.

The etching process includes a microwave source 12, which produces a fluorine-containing gas plasma 14. The plasma 14 is emitted from the source 12 and guided through a sapphire containment tube 16. The containment tube 16 is composed primarily of sapphire since it is non reactive with the fluorine gas. The plasma 14 bombards the silicon wafer 18 with energetic ions which causes sputtering of the surfaces to be etched.

A sapphire shield 24 surrounds the silicon wafer 18 during this process to contain the plasma 14 therein and to prevent the plasma from reacting with chamber walls 15. The sapphire is utilized because it is chemically inert even under extreme conditions. It easily withstands harsh chemicals such as fluorine plasma and other industrial gases and fluids, with no particle generation. Also, the melting point of sapphire is over 2000 degrees C., making it ideal for high temperature applications. Moreover, sapphire can transmit ultraviolet, visible and infrared light, as well as microwaves, a range broader than most materials.

To position the wafer 18, an end effector 20 utilizes vacuum pressure to securely grip the silicon wafer 18 as the effector 20 extends through the generally rectangular aperture 22 of the bonded polygonal sapphire shield 24. The wafer 18 is placed on a set of retractable lift pins 26, as the end effector 20 retracts laterally through the aperture 22. The lift pins 26 then retract downwardly through lift pin holes 28 until the wafer 18 contacts the top surface of the chuck 30. The chuck 30 typically employs vacuum pressure or electrostatic charge to clamp the silicon wafer 18 flat against the chuck 30.

During operation, the sapphire shield 24 protects the chamber walls (not shown) by reducing the energy of the ions as they pass by the shield 24 to such a level that sputtering of the chamber walls cannot occur. Moreover, the silicon wafer 30 is shielded from any contaminants, which are generated from the chamber walls.

Though this embodiment shows the sapphire shield 24 utilized to protect silicon wafers 18 during a plasma etching process 10, it will be clear to one skilled in the art that the process may be used to protect wafers during other processes as well. By way of example, the sapphire shield 24 could be used in a chemical vapor deposition process, a physical vapor deposition process or ion implantation. Additionally, the sapphire shield 24 could be used to protect objects other than wafers, e.g., individual circuit boards or chips.

Figure 3:
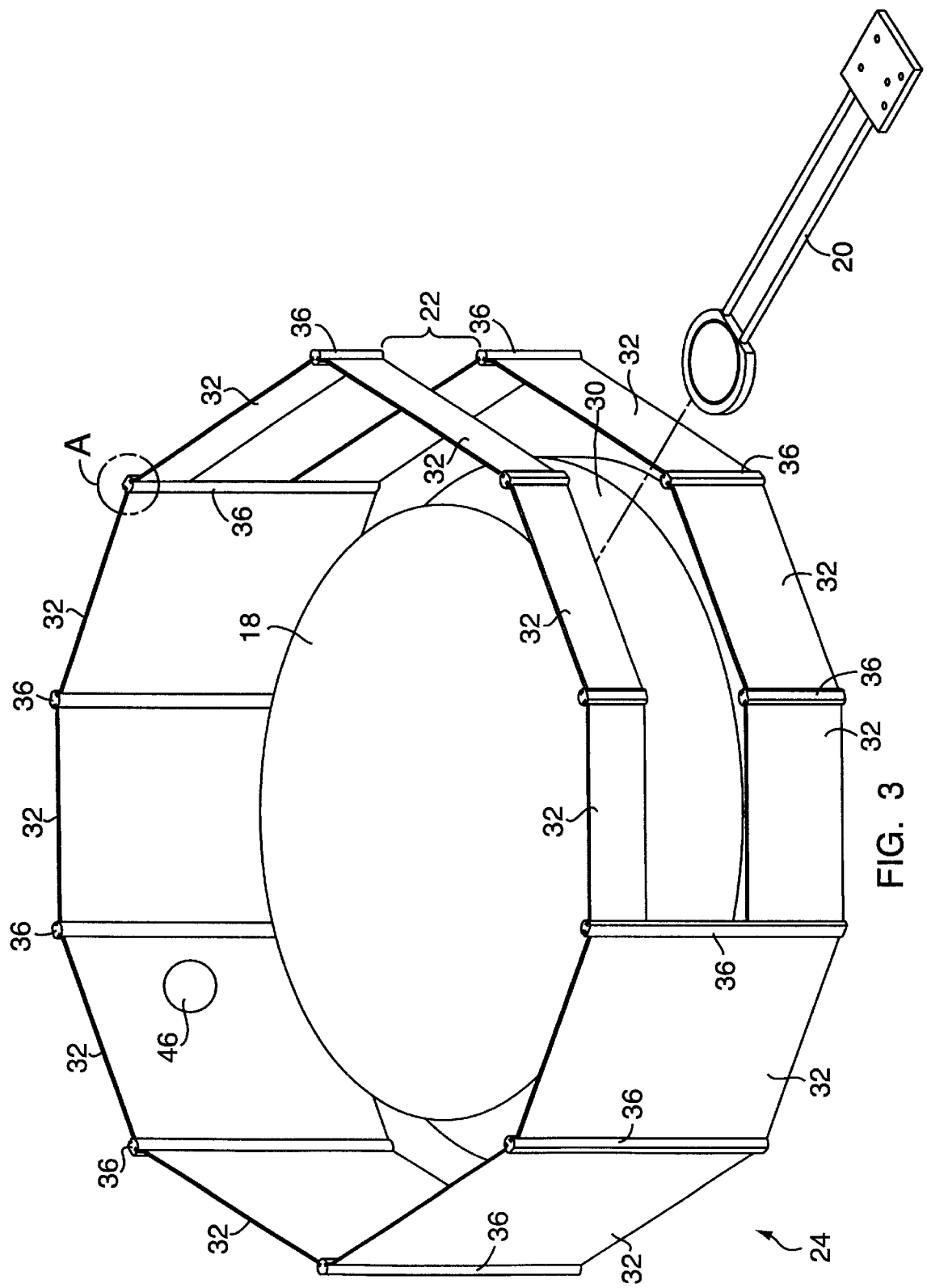
FIG. 3 is a perspective view of the sapphire shield of FIG. 1.
Figure 4:
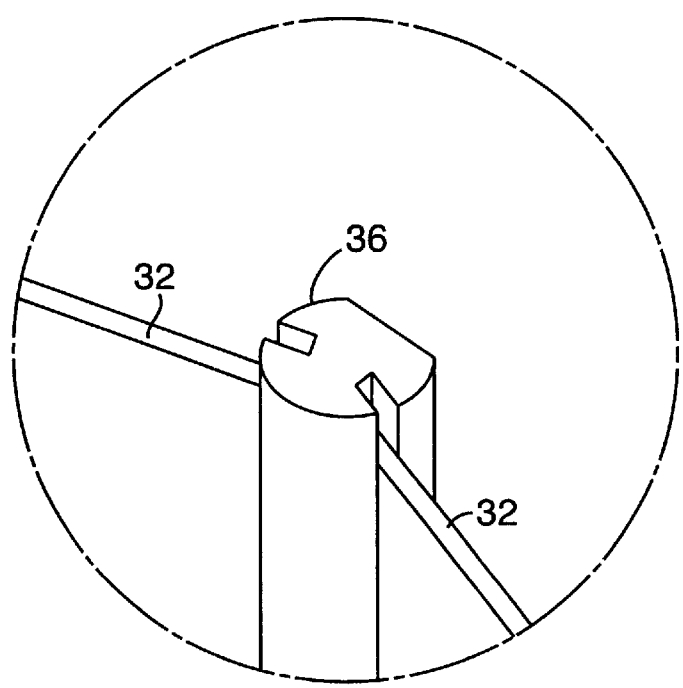
FIG. 4 is an expanded view of the circled area A of FIG. 3.
Figure 5:
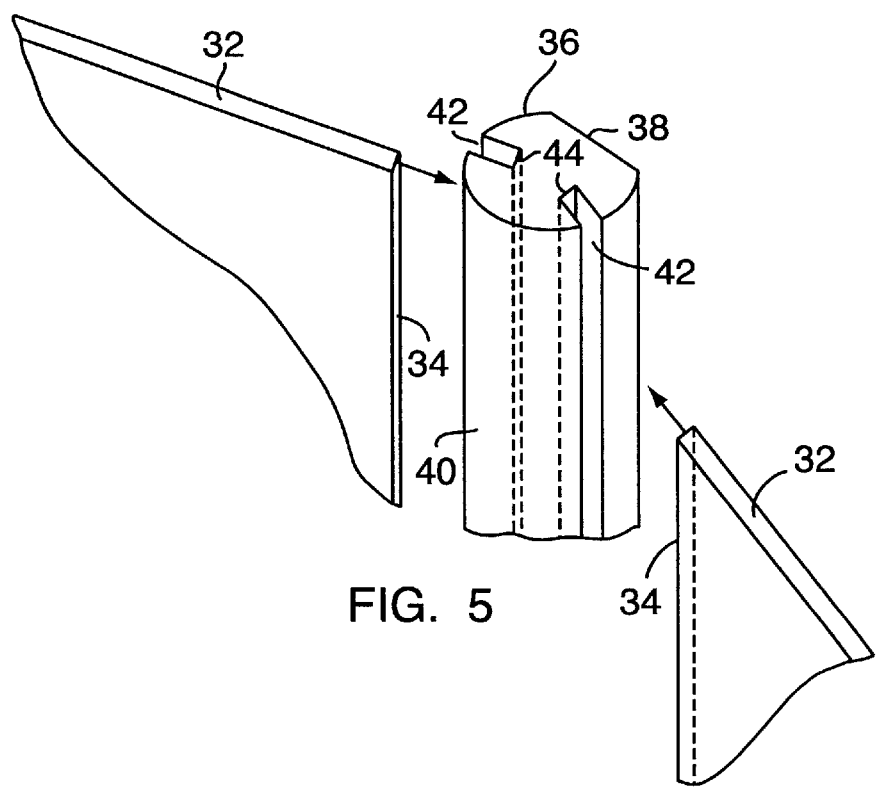
FIG. 5 is an exploded view of FIG. 4.

Referring to FIGS. 3, 4 and 5, the sapphire shield 24 includes a plurality of sapphire single crystal shielding members 32 each including a pair of first interface surfaces 34 (best seen in FIG. 5) located on opposing ends thereof. Though the shielding members 32 are shown as being generally flat plates other shaped shielding members may also be used, e.g., arcuate shielding members.

The shield 24 also includes a plurality of sapphire single crystal structural members 36. The structural member 36 are generally rod shaped with a flatly ground outer perimeter 38 and an arcuate inner perimeter 40. A pair of vertically extending grooves 42 are located on opposing sides of the structural member 36 between the outer perimeter 38 and inner perimeter 40. The grooves 42 are sized to receive the end portion of the shielding member 32. The bottom inside surface of each groove 42 provides a second interface surface 44 against which the first interface surface 34 engages. Though the structural members are shown as being generally rod shaped, other shaped structural members may also be used, e.g., generally bar shaped.

Additionally, one skilled in the art would recognize that the second interface surfaces 44 do not have to be located at the bottom inside surface of a groove. For example, the inner perimeter 40 of the structural member 36 may be machined flush with the groove 42, i.e., one side of the groove can be removed, to leave a stepped surface for the second interface surface 44.

The shielding members 32 and structural members 36 are alternately bonded together at their respective first and second interface surfaces 34 and 44 to define an enclosed generally polygonal shaped area sized to receive the silicon wafers therein. Any compound used to bond the first 34 and second 44 interface surfaces together must have substantially equivalent coefficients of expansion and chemical compatibility as the sapphire plates 32 (shielding members) and rods 36 (structural members). Additionally, the compound or must have a melting point sufficiently high enough to withstand the same high temperature processes the shielding 24 will be subjected to. One such compound used in this case is a yttrium-containing eutectic bonding compound as described in detail in U.S. Pat. No. 6,012,303, which is herein incorporated by reference.

Additionally, as will be explained in greater detail hereinafter, the bonded first and second interface surfaces 34 and 44 must have orientations that are aligned along a like lattice plane of the crystal shielding members 32 and structural members 36. This is because the coefficients of expansion along different lattice planes varies within the lattice of the crystal itself. Accordingly, if the first and second interface surfaces 34 and 44 had orientations aligned along different lattice planes, the shield 24 could crack under high temperature processing operations.

The shielding members 32 and structural members 36 may come in a variety of sizes. For example, some of the bonded shielding members 32 and structural members 36 are cut shorter than the rest to define the generally rectangular shaped aperture 22, through which the silicon wafer 18 and spatula like effector 20 pass to be loaded onto the chuck 30. Additionally, the shielding members may include a through-hole 46 through which instrument probes may be extended to measure various process parameters, e.g., temperature or pressure.

Figure 6:
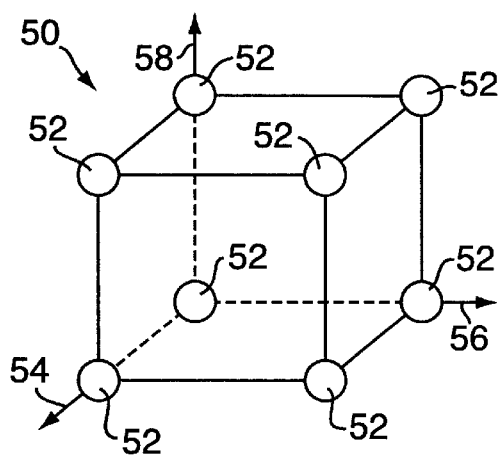
FIG. 6 is a schematic view of a cubic unit cell of a crystal lattice in accordance with the present invention.

Referring to FIG. 6, a representative unit cell 50 of a simple cubic crystal lattice is shown generally at 50. The periodic arrangement of atoms 52 in a crystal is called its lattice. A crystal lattice, such as the crystal lattice of the sapphire shielding members 32 and structural members 36, always contains a volume which is representative of the entire lattice called the unit cell 50. The unit cell 50 is regularly repeated throughout the entire crystal lattice. For each unit cell 50, vectors can be defined (basis vectors) 54, 56 and 58 such that if the unit cell 50 is translated by integral multiples of these vectors 54, 56, 58, a new unit cell identical to the original is found. The importance of the unit cell 50 is that the crystal as a whole can be studied by analyzing a representative volume. For example, distances of nearest atoms 52 can be calculated, as can the periodic properties of the crystal.

Figure 7:
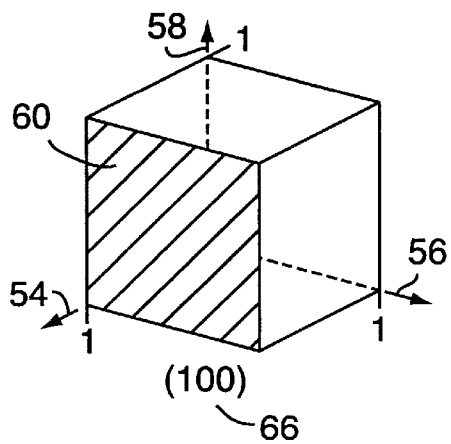
FIG. 7 is a schematic view of the cubic unit cell of FIG. 6 illustrating the (100) lattice plane.
Figure 8:
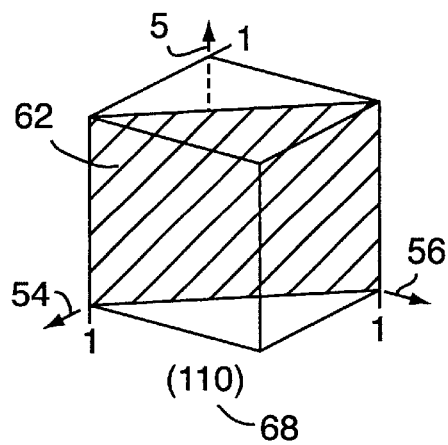
FIG. 8 is a schematic view of the cubic unit cell of FIG. 6 illustrating the (110) lattice plane.
Figure 9:
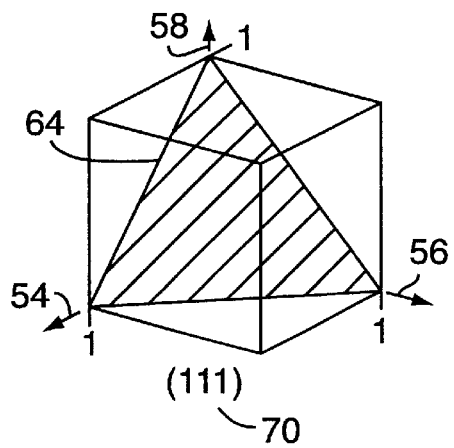
FIG. 9 is a schematic view of the cubic unit cell of FIG. 6 illustrating the (111) lattice plane.

Referring to FIGS. 7, 8 and 9, the arrangement of atoms 52 in the unit cells 50 also defines a set of lattice planes 60, 62 and 64 in the crystal. A set of Miller indices, 66, 68 and 70 defines the orientation of the lattice planes 60, 62 and 64, which can be calculated from the basis vectors 54, 56 and 58. For example, one such method in which the Miller indices can be derived is described in Chapter 1, page 2 of the text titled "Silicon Processing for the VLSI Era", Vol. 1, Second Edition, by authors Stanley Wolf and Richard Tauber, published by Lattice Press, copyright dated 2000, having ISBN number 0-9616721-6-1, which is herein incorporated by reference. The method described therein is as follows:

1. The intercepts of the planes with the crystal axes are found, and these intercepts are expressed as integral multiples of the basis vectors.
2. The reciprocal of the three integers found in step 1 are taken.
3. The smallest set of integers h, k, and l are found that have the same relationship to each other as the three reciprocals. These integers are the Miller indices of the plane, and the plane is labeled (h, k, l). For example, if ¼, ⅓ and ½ are the three reciprocals, then 3, 4, and 6 are the three smallest integers, i.e., the Miller indices, whose relative values are the same as the relative values of the three reciprocals.

It is important to note that the simple cubic unit cell 50 has been used herein for illustrative purposes only, and its lattice planes only require Miller indices consisting of three integers to define their orientation. However, one skilled in the art would recognize that more complex unit cells exist. For example, the crystal structures of the sapphire shielding members 32 and structural members 36 have triagonal hexagon unit cell lattices, which require Miller indices of four integers, e.g., (0001), to define the lattice plane orientations.

One of the important factors of lattice plans in general is that the coefficient of expansion of the crystal varies in a direction perpendicular to the orientation of these planes. Therefore, it is important that the first and second interface surfaces 34 and 44 have an orientation that is aligned along the same lattice plan. That is, the Miller indices of the first and second interface surfaces 34 and 44 must be substantially identical to the Miller indices of one of the lattice planes of the unit cell or the shield could crack under high temperature operations.

A method for producing the sapphire shield such that the first and second interface surfaces 34 and 44 align along a like lattice plan is described in the co-pending application entitled "Method for Producing a Polygonal Sapphire Structure", to Ardini et al. (Attorney Docket No. 6096-04) filed concurrently herewith and incorporated herein by reference. Per that method, consideration is given to positively identify and match the orientation of each bonded piece, i.e., a shielding member 32 or a structural member 36, before the interface surfaces 34, 44 are machined into the piece. This can be accomplished through a variety a methods including the use of cross-polarizing filters or Laue X-ray imaging.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A shield for protecting silicon wafers, the shield comprising:
    a plurality of single crystal shielding members having a lattice unit cell repeated substantially throughout, the unit cell having a periodic arrangement of atoms defining a set of lattice planes, the shielding members each including a pair of first interface surfaces having an orientation substantially aligned along one of the set of lattice planes; and
    a plurality of single crystal structural members, each structural member having substantially the same lattice unit cell as that of the shielding members repeated substantially throughout, the structural members each including a pair of second interface surfaces having an orientation substantially aligned along the same one of the set of lattice planes;
    wherein the plurality of shielding members and structural members are alternately bonded together at their respective first and second interface surfaces to define an enclosed area sized to receive the silicon wafers therein.

2. The shield of claim 1 wherein the shielding members comprise sapphire plates.

3. The shield of claim 1 wherein the structural members comprise one of sapphire bars and sapphire rods.

4. The shield of claim 1 wherein the shielding members and structural members are bonded together with a eutectic bonding material.

5. The shield of claim 4 wherein the eutectic bonding material comprises an yttrium-containing compound.

6. The shield of claim 1 wherein the enclosed area is generally polygonal in shape.

7. The shield of claim 1 wherein a structural member comprises a pair of opposing grooves each having a second interface surface as an inside surface, the grooves being sized to receive a first interface surface therein.

8. The shield of claim 1 wherein at least one of the shielding members includes a through hole sized to receive a sensing instrument.

9. The shield of claim 1 wherein bonded shielding members and structural members further define at least one aperture sized to receive the silicon wafers therethrough.

10. The shield of claim 1 wherein the orientations of the lattice planes are defined by a set of miller indices, and wherein the first and second interface surfaces have orientations substantially defined by an identical one of the set of miller indices.

11. The shield of claim 1 wherein a plurality of such shields are stackable.

12. A shield for protecting silicon wafers, the shield comprising:
    a plurality of single crystal shielding members having a lattice unit cell repeated substantially throughout, the unit cell having a periodic arrangement of atoms defining a set of lattice planes, each plane having an orientation defined by a set of miller indices, the shielding members each including a pair of first interface surfaces having an orientation substantially defined by an identical one of the set of miller indices; and
    a plurality of single crystal structural members, each structural member having substantially the same lattice unit cell as that of the shielding members repeated substantially throughout, the structural members including a pair of second interface surfaces having an orientation substantially defined by the same one of the set of miller indices;
    wherein the plurality of shielding members and structural members are alternately bonded together at their respective first and second interface surfaces to define an enclosed area sized to receive the silicon wafers therein.

13. The shield of claim 12 wherein the shielding members comprise sapphire plates and the structural members comprise one of sapphire bars and sapphire rods.

14. The shield of claim 12 wherein a structural member comprises a pair of opposing grooves each having a second interface surface as an inside surface, the grooves being sized to receive a first interface surface therein.

15. The shield of claim 12 wherein the bonded shielding members and structural members further define at least one aperture sized to receive the silicon wafers therethrough.

16. The shield of claim 12 wherein the shielding members and structural members are bonded together with a eutectic bonding material.

17. A shield for protecting silicon wafers, the shield comprising:

a plurality of sapphire single crystal shielding members each including a pair of first interface surfaces; and a plurality of sapphire single crystal structural members, each including a pair of second interface surfaces;

wherein the plurality of shielding members and structural members are alternately bonded together at their respective first and second interface surfaces to define an enclosed area sized to receive the silicon wafers therein; and wherein the bonded first and second interface surfaces are aligned along a like lattice plane of the shielding members and the structural members.

18. The shield of claim 17 wherein the shielding members and structural members are bonded together with a eutectic bonding material.

19. The shield of claim 18 wherein the eutectic bonding material comprises an yttrium-containing compound.

20. The shield of claim 17 wherein the shielding members comprise sapphire plates and the structural members comprise one of sapphire bars and sapphire rods.

21. The shield of claim 17 wherein a structural member comprises a pair of opposing grooves each having a second interface surface as an inside surface, the grooves being sized to receive a first interface surface therein.

22. The shield of claim 17 wherein bonded shielding members and structural members further define at least one slot sized to receive the silicon wafers therethrough.

23. The shield of claim 17 wherein the enclosed area is generally polygonal in shape.

24. A method of forming a semiconductor device comprising:

surrounding a wafer with a shield according to any one of claims 1 through 23; and processing said wafer while shielding the wafer with said shield.

* * * * *